(12) United States Patent
Kawabe et al.

(10) Patent No.: US 8,728,950 B2
(45) Date of Patent: May 20, 2014

(54) COATING METHOD, AND ORGANIC ELECTROLUMINESCENCE ELEMENT

(75) Inventors: Shigetoshi Kawabe, Tokyo (JP); Nobuaki Takahashi, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 104 days.

(21) Appl. No.: 13/260,068

(22) PCT Filed: Jun. 15, 2010

(86) PCT No.: PCT/JP2010/060097
§ 371 (c)(1),
(2), (4) Date: Sep. 23, 2011

(87) PCT Pub. No.: WO2010/147108
PCT Pub. Date: Dec. 23, 2010

(65) Prior Publication Data
US 2012/0032157 A1    Feb. 9, 2012

(30) Foreign Application Priority Data
Jun. 18, 2009   (JP) .................................. 2009-145201

(51) Int. Cl.
*H01L 21/31*    (2006.01)

(52) U.S. Cl.
USPC ............... 438/758; 257/40; 427/66; 427/331; 427/438; 118/410; 118/411

(58) Field of Classification Search
USPC ............... 438/758; 427/331, 438, 434.3, 131; 118/410, 411, 412; 257/40, E21.018
See application file for complete search history.

(56) References Cited

U.S. PATENT DOCUMENTS

| | | | | |
|---|---|---|---|---|
| 4,106,437 A | * | 8/1978 | Bartlett | 118/412 |
| 5,030,484 A | * | 7/1991 | Chino et al. | 427/434.3 |
| 5,682,043 A | * | 10/1997 | Pei et al. | 257/40 |
| 5,733,608 A | * | 3/1998 | Kessel et al. | 427/547 |
| 5,804,256 A | * | 9/1998 | Schafer | 427/558 |
| 2006/0062899 A1 | * | 3/2006 | Rankin et al. | 427/58 |
| 2006/0147637 A1 | * | 7/2006 | Cooprider et al. | 427/355 |

FOREIGN PATENT DOCUMENTS

| | | |
|---|---|---|
| JP | 09-248508 | 9/1997 |
| JP | 2000-070813 | 3/2000 |
| JP | 2000-233151 | 8/2000 |
| JP | 2001-006663 | 1/2001 |
| JP | 2006-305548 | 11/2006 |
| JP | 2007-098224 | 4/2007 |

(Continued)

*Primary Examiner* — Theresa T Doan
(74) *Attorney, Agent, or Firm* — Lucas & Mercanti, LLP

(57) ABSTRACT

Disclosed are a coating method of forming a coating with a stable thickness from a coating solution with a low viscosity employing a slit-type die coater and an organic electroluminescence element prepared employing the coating method. The coating method employing a slit-type die coater comprises the steps of allowing a lip tip of the slit-type die coater to bring close to the substrate to form a coating solution bead between the lip tip and the substrate, and coating on the substrate a coating solution ejected from a slit outlet at the lip tip while relatively moving the slit-type die coater and the substrate, thereby forming at least two coating layers in the stripe shape, featured in that the lip tip has at least one groove in the coating region in the coating width direction, and a pressure at the slit outlet of the coating solution of the bead is negative or zero.

9 Claims, 4 Drawing Sheets

(56) References Cited

FOREIGN PATENT DOCUMENTS

| JP | 2007-268324 | 10/2007 |
|----|-------------|---------|
| JP | 2007-313417 | 12/2007 |
| JP | 2008-246280 | 10/2008 |
| JP | 2009-022867 | 2/2009 |
| JP | 2009-106867 | 5/2009 |

* cited by examiner

COATING METHOD, AND ORGANIC ELECTROLUMINESCENCE ELEMENT

This application is a 371 of PCT/JP2010/060097 filed Jun. 15, 2010 which, in turn, claimed the priority of Japanese Patent Application No. 2009-145201 filed Jun. 18, 2009, both applications are incorporated by reference herein.

TECHNICAL FIELD

The present invention relates to a coating method in which a coating solution with a low viscosity is coated on a continuously running substrate employing a slit-type die coater to form a thin layer in the stripe shape, and an organic electronic element prepared according to the coating method.

TECHNICAL BACKGROUND

As a coating method of coating a coating solution on a running substrate, there are known the following two coating methods. One is a post-measuring method in which a coating solution in an amount more than a coating solution amount to give a necessary coating thickness is in advance ejected onto a substrate and the extra coating solution was removed through any coating solution removing means. As the post-measuring methods, there are known a blade coating method, an air knife coating method, a wire bar coating method, a gravure coating method, a reverse coating method and a reverse roller coating method.

The other one is a pre-measuring method in which a coating solution in an amount to give a necessary coating thickness is in advance ejected onto a substrate. As the pre-measuring methods, there are known an extrusion coating method employing a slit-type die coater, a slide coating method employing a slide coater, a curtain coating method, and a coating method employing an ink jet head. In a pre-measuring coating apparatus, a slit-type die coater can meet high coating accuracy, high quality, high coating speed, thin film coating and a multi-layer coating property as compared to other pre-measuring coating apparatuses. Accordingly, the a slit-type die coater is employed to manufacture an optical film, an ink jet recording paper sheet, a recording material for thermal development and an organic electroluminescence element (hereinafter also referred to as organic EL element).

The organic EL element is used in a display field, illumination field and the like, and generally manufactured by a vapor deposition method. In recent years, however, the organic EL element is manufactured by a coating method called a roll-to-roll method in view of productivity or manufacturing cost.

Further, requirement for high functionality, thickness reduction, coating thickness uniformity or high productivity of an organic EL element has increased.

For example, when an organic compound layer (such as a hole transporting layer, a light emission layer, etc.) constituting an organic EL element is coated by a coating method, a viscosity of a coating solution used is not more than 4.0 mPa·s. The hole transporting layer as the organic compound layer has a thickness of from 5 to 500 nm, and one layer constituting the light emission layer has a thickness of from 2 to 100 nm, both layers being thin. Accordingly, uniformity of the organic compound layer thickness has an influence on performance of the organic EL element, and requirement for the thickness uniformity has increased.

In a conventional extrusion coating method employing a slit-type die coater in which a coating solution with a viscosity of several mPa·s is coated at a coating speed of from several tens m/minute to several hundreds m/minute to form a thin film, the coating thickness distribution is reduced to several percents by carrying out coating under such conditions that a pressure upstream of the slit-type die coater is reduced, the coater gap is at least about 100 μm which is from 3 to about 10 times the wet coating thickness, and the coater gap accuracy is several percent (accuracy from the limit of mechanical accuracy such as straightness of the slit-type die coater or the cylindricity or rotation accuracy of the backup roller. Herein, the coater gap implies a clearance between the lip tip of the slit-type die coater and the substrate.

That is, in the conventional extrusion coating method, to maintain the bead under increased pressure is condition of stable coating. The coater gap is preferably larger, since a smaller coater gap produces poor coating thickness distribution. However, when the coater gap is enlarged to two times or more the wet coating thickness, the bead is put under negative pressure atmosphere caused due to accompanying air generating with transport of a substrate, and cannot maintain its shape, which results in incapability of stable coating.

In order to prevent the bead from being put at negative pressure, a method is carried out which cuts the accompanying air by reducing a pressure upstream of the slit-type die coater. When the pressure is not reduced, the coater gap is from 1.5 to 2 times the wet coating thickness, and when the pressure is reduced, the coater gap is at most ten times the wet coating thickness.

Accordingly, when coating is carried out at a wet coating thickness of not more than 10 μm employing an extrusion coating method, it is necessary to lessen the water gap to not more than 100 μm even under reduced pressure. Such a small gap produces poor coating thickness distribution.

A method has been hitherto studied in which employing a low viscosity coating solution, coating is carried out according to an extrusion coating method employing a slit-type die coater to form a stable thin layer. A method is disclosed in for example, Japanese Patent O.P.I. Publication No. 2007-98224 in which when a coating solution with a low viscosity is coated into a thin layer on a continuously running web (corresponding to a belt-shaped substrate in the invention) supported on a backup roller employing a slot die (corresponding to a slit-type die coater in the invention), a slot die with a slot die tip in the concave form, in which a clearance between the backup roller and the center in the width direction of the slot die tip is different by 1 to 10 μm from that between the back roller and each of both edges in the width direction of the slot die tip, is employed in order to prevent wet expansion, wet shrinkage or distortion in the die width direction of the slot die.

As a coating apparatus coating a coating solution with a viscosity of from 1 to 10 mP·s on a substrate (corresponding to the belt-shaped substrate used in the invention), an extrusion coater (corresponding to the slit-type die coater used in the invention) having a coating solution ejecting slit width of from 60 to 120 μm and a manifold diameter of from 12 to 18 mm is disclosed in Japanese Patent O.P.I. Publication No. 2006-305548.

However, it has proved that in the extrusion coating method employing a slit-type die coater disclosed in the above patent document, when a coating solution with a low viscosity is coated, control of wet expansion of the coating solution on coating is insufficient, and when the coating solution is coated at a wet coating thickness of not more than 5 μm, the coating width and thickness cannot be sufficiently controlled, which results in non-uniformity of the thickness.

In order to improve productivity as compared to the roll-to-roll method, a method of manufacturing an organic EL panel has been studied in which an organic compound layer (for example, a hole transporting layer, a light emission layer or the like) is coated to be in accordance with plural rows of electrodes provided on a wide substrate employing a slit-type die coater to form multiple coating layers in the stripe shape, thereby obtaining an organic EL element, and then cut into an individual organic EL element. As the method to form multiple layers in the stripe shape, a method is disclosed in Japanese Patent O.P.I. Publication No. 2001-6663 which employs an extrusion coater having a slit with guides provided therein to divide into many small slit parts. However, it has been found that when employing such an extrusion coater, a coating solution with a low viscosity is coated, control of wet expansion of the coating solution is insufficient, and it is difficult to form multiple stripe-shaped coating films.

Further, a method has been studied in which a coating solution with a low viscosity is coated on a substrate to stably form multiple coating layers in the stripe shape. For example, a method is known in which employing a slit-type die coater with many grooves provided at a specific pitch at the land of the die head, a coating solution is ejected into a film form from the slit-type die coater and coated on a substrate, the slit die coater increasing a coating gap (corresponding to a coater gap) between the die coater and the substrate so that the coating solution ejected into a film is divided by the grooves and coated to form multiple coating layers in the stripe shape separated from each other on the substrate (refer to Patent Document 1).

However, it has been found that the method disclosed in the Patent Document 1 has shortcomings as follows.

1. Since a coating solution is supplied to a slit-type die coater under increased pressure and ejected from the slit outlet thereof, a large amount of the coating solution is ejected, and as a result, coating at a wet coating thickness of not less than 25 μm is possible, but when a coating solution with a low viscosity of not more than 3.0 mPa·s is coated at a low wet coating thickness of from 0.1 to 5.0 μm, the width and thickness of the resulting coating layers in the stripe shape are not stabilized.

2. The coater gap is susceptible to vibration due to transport of a substrate, a straightness of a slit-type die coater, or a cylindricity or vibration due to rotation of a backup roller used as a substrate supporting member, the width of coating portions and that of non-coating portions are influenced by variation of the coater gap and likely to vary. Such a variation of the coating width dimension results in instability of coating in the stripe-form.

3. Since a coating solution is supplied to a slit-type die coater under increased pressure and ejected from the slit outlet thereof, a coating solution with a low viscosity enter the grooves which makes it difficult to divide the ejected coating solution, resulting in incapability of forming coating layers in the stripe shape. Even in the case the coating solution shortage at the groove portions is produced by increasing the coater gap between the substrate and the slit-type die coater to form coating layers in the stripe shape, the coating solution shortage extends to other portions which makes it difficult to control the width of coating portions and non-coating portions and results in incapability of stable coating.

4. Since coating portions and non-coating portions are formed according to the coater gap size, the method can be applied to coating at a small pitch (coating portion width+ non-coating portion width), but is low in a degree of freedom of establishment of coating portions and non-coating portions.

In view of the above, a coating method has been desired in which employing an extrusion coating method employing a slit-type die coater, a coating solution with a low viscosity is coated on a substrate, so that non-coating portions and coating portions are alternately formed in the stripe shape in the conveyance direction of the substrate, whereby the coating thickness and width of each coating layer formed in stripe shape are stabilized, and an organic electroluminescence element prepared employing the coating method has been desired.

PRIOR ART LITERATURES

Patent Documents

Patent Document 1: Japanese Patent O.P.I. Publication No. 2007-313417

DISCLOSURE OF THE INVENTION

Problems to be Solved by the Invention

In view of the above, the present invention has been made. An object of the invention is to provide a coating method in which employing an extrusion coating method employing a slit-type die coater, a coating solution with a low viscosity is coated on a substrate, so that non-coating portions and coating portions are alternately formed in the stripe shape in the conveyance direction of the substrate, whereby the coating thickness and width of each of the coating portions formed in the stripe shape are stabilized, and to provide, an organic electroluminescence element prepared employing the coating method.

Means for Solving the Above Problems

The above object of the invention has been attained by the following constitutions.

1. A coating method of coating a coating solution on a substrate employing a slit-type die coater, the method comprising the steps of allowing a lip tip of the slit-type die coater to bring close to the substrate to form a bead between the lip tip and the substrate, and coating on the substrate a coating solution ejected from a slit outlet at the lip tip while relatively moving the slit-type die coater and the substrate, thereby forming at least two coating layers in a stripe shape, featured in that the lip tip has at least one groove in a coating region in a coating width direction and the coating is carried out at a pressure at the slit outlet of the coating solution of the bead being negative or zero.

2. The coating method of item 1 above, featured in that the coating layers formed on the substrate have a wet coating thickness of from 0.1 to 5.0 μm.

3. The coating method of item 1 or 2 above, featured in that the coating solution has a viscosity of not more than 4.0 mPa·s.

4. The coating method of any one of items 1 through 3 above, featured in that the clearance between the substrate and the lip tip is from 30 to 300 times the wet coating thickness.

5. The coating method of any one of items 1 through 4 above, featured in that the lip tip is composed of a front lip and a back lip, wherein a position of a groove in the front lip is substantially the same as that of a groove in the back lip, and a width in the coating width direction of the groove is not less than 0.5 mm.

6. The coating method of any one of items 1 through 5 above, featured in that the groove has a depth of from 0.1 to 10 mm.

7. The coating method of any one of items 1 through 6 above, featured in that the coating solution is coated on the substrate at a coating speed of from 0.1 to 10.0 m/minute.

8. An organic electroluminescence comprising a substrate and provided thereon, a first electrode, a second electrode and an organic compound layer including a light emission layer, the an organic compound layer being provided between the first electrode and the second electrode element, featured in that the organic compound layer is formed by the coating method of any one of items 1 through 7 above.

Effects of the Invention

The present invention can provide a coating method in which employing an extrusion coating method employing a slit-type die coater, a coating solution with a low viscosity is coated on a substrate, so that non-coating portions and coating portions are alternately formed in the stripe shape in the conveyance direction of the substrate, whereby the coating thickness and width of each of the coating portions formed in the stripe shape are stabilized, and can provide an organic electroluminescence element prepared employing the coating method.

PREFERRED EMBODIMENT OF THE INVENTION

Figure 1A:
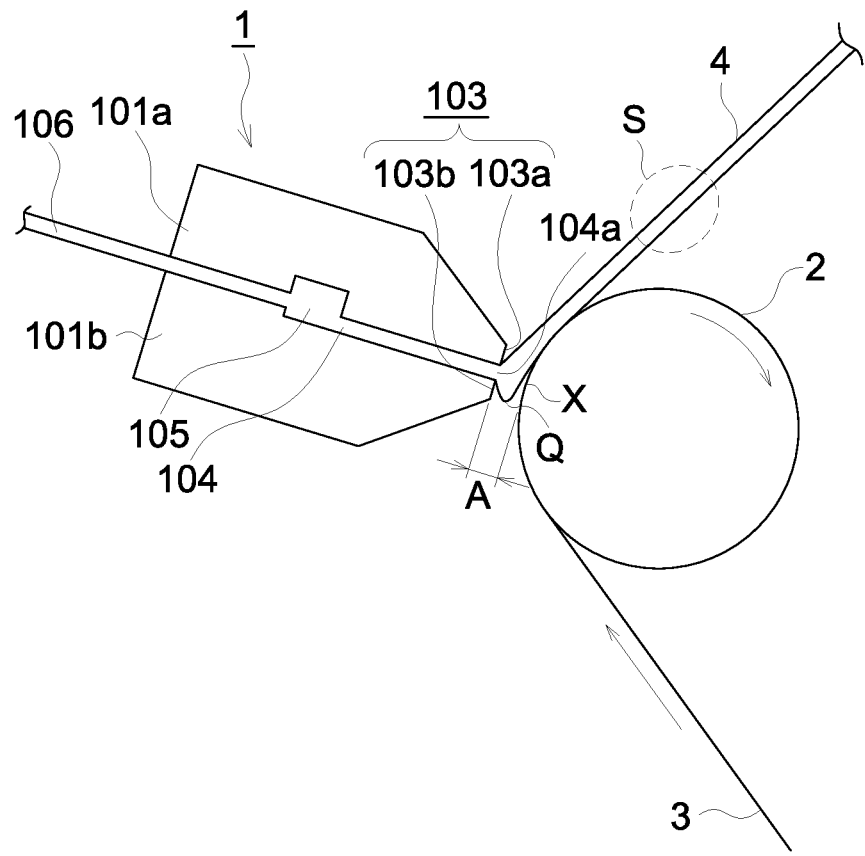
FIG. 1 is a schematic view showing the state carrying out coating employing a slit-type die coater.

The present invention relates to a coating method in which employing a slit-type die coater having at least one groove at the lip tip in the coating region in the coating width direction, a coating solution is coated on a substrate in the stripe shape at a pressure at the slit outlet of the coating solution being negative or zero, a coating bead being formed between the substrate and the lip tip of the coater.

A coating method is disclosed in Patent Document 1 which employing a slit-type die coater having at least one groove at the lip tip in the coating region in the coating width direction, a low viscosity coating solution is coated on a substrate in the stripe shape. However, there is no disclosure therein regarding control of wet spreading during coating of each stripe of the coating solution or control of the coating width and coating layer thickness when coating is carried out at a wet coating thickness of not more than 5 μm.

As a coating method in which employing a slit-type die coater, a coating solution is coated on a substrate in the stripe form, there are known the following two methods.

1) A method employing a slit-type die coater in which a separating member to separate the slit outlet into two or more outlets is introduced in the slit to form coating portions and non-coating portions.

2) A method employing a slit-type die coater in which a groove is provided at the lip tip to be in accordance with a coating in the stripe form.

In the method 1) employing the separating member, a coating solution is supplied to the slit-type die coater under pressure and ejected from the slit outlet. In this case, a low viscosity coating solution of 4.0 mPa·s or less ejected from both ends of each of the outlets separated from each other is wet spread in the coating width direction, which makes it difficult to form a coating in the stripe form in which a coating portion and a non-coating portion are alternately formed in the conveyance direction.

In the method 2) in which a groove is provided at the lip tip to be in accordance with a coating in the stripe form, a coating solution is supplied to the slit-type die coater under pressure and ejected from the slit outlet. In this case, a coating solution is also supplied in the groove, and the groove is filled with the coating solution. As a result, the coating solution in the groove forms beads together with a coating solution ejected from the silt outlet other than the groove, which also makes it difficult to form a coating in the stripe form.

The present inventors have made a study on a method in which a coating solution with a low viscosity is coated in the stripe shape at a thin coating thickness on a substrate so that coating portions and non-coating portions are alternately formed in the conveyance direction, employing a slit-type die coater having at least one groove at the lip tip in the coating region in the coating width direction, and they have found the followings.

1) A coating solution ejected from the lip tip forms a bead between the substrate and the lip tip and is pulled by the substrate, whereby coating is carried out at a pressure at the slit outlet being negative or zero.

2) When the wet coating thickness of a coating layer, in which a coating solution is coated on the substrate and formed, is from 0.1 to 5.0 μm, a pressure at the slit outlet is negative or zero, which results in ease of coating.

3) The coating solution with a solution viscosity of not more than 4.0 mPa·s is more stably supplied to the lip tip at a pressure at the slit outlet being negative or zero.

4) In order to prevent an influence on the bead of an accompanying air induced by conveyance of the support, coating is carried out at a coating speed of not more than 10 m/minutes which is a speed generating no accompanying air, whereby stabilization of the bead is easily obtained.

5) Since the coating solution is supplied without increased pressure applied, the groove provided at the lip tip is not filled with the coating solution, and further, when the coating solution is in contact with the substrate to form a bead, the coating solution ejected from the lip tip is continuously pulled by a conveying substrate through capillary action, completely coated on the substrate, and does not flow into the groove. Accordingly, the groove provides non-coating portions, and enables formation of coating layers in the stripe shape composed of non-coating portions and coating portions.

6) Since the bead is formed at a pressure at the slit outlet being negative or zero, a clearance between the substrate and the lip tip (also referred as to a coater gap) is not influenced by coating layer thickness as long as it is such that the coating solution can bridge between the substrate and the lip. Accordingly, it has been proved that even when the wet coating thickness is not more than 5 μm, coating can be carried out at a coater gap extremely broad relative to the wet coating thickness such as a gap being 30 times or more the wet coating thickness. As a result, since the coating thickness distribution in the coating width direction is generally approximate to mechanical accuracy/coater gap, increase in the gap can provide good coating thickness distribution without being influenced by mechanical accuracy.

In the invention, when employing a slit-type die coater having at least one groove in the lip tip in the coating width direction at the coating region, a coating solution with a low viscosity is coated on a substrate at a pressure at the slit outlet of a bead being negative or zero, so that non-coating portions and coating portions are alternately formed in the stripe form in the conveyance direction of the substrate, it is preferred that coating is carried out under the following conditions.

1. The wet coating thickness is from 0.1 to 5 μm.
2. The viscosity of the coating solution is not more than 4.0 mPa·s.
3. The coater gap of the slit-type die coater is from 30 to 300 times the wet coating thickness.
4. The coating speed is such that accompanying air is not produced.

The conditions described above solve problems which are raised when employing a conventional slit-type die coater having a groove in the lip tip, a coating solution with a low viscosity is coated in the stripe form on a substrate, and enable provision of a coating method in which a film coating in the stripe form can be stably obtained without being affected by the mechanical accuracy.

Next, the embodiment of the invention will be explained referring to FIGS. 1 through 4, however, the invention is not specifically limited thereto.

Figure 1B:
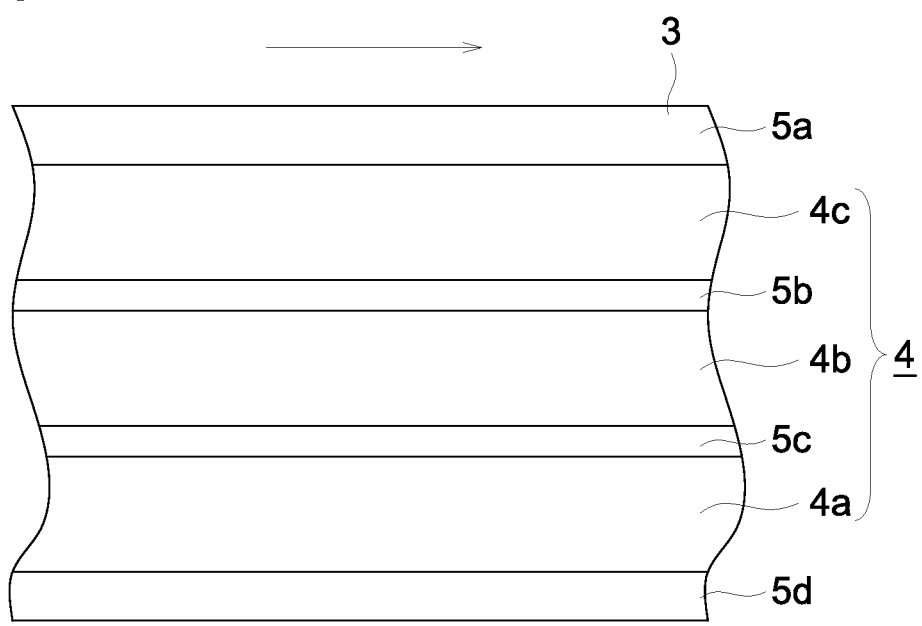

FIG. 1 is a schematic view showing the state carrying out coating employing a slit-type die coater. FIG. 1a is a schematic sectional view showing the state carrying out coating employing a slit-type die coater of the pre-measuring type. FIG. 1b is a schematic plan view of a portion shown by S in FIG. 1a. In this figure, a belt-shaped substrate is used as a substrate.

FIG. 1a will be explained. In the figure, numerical number 1 shows a slit-type die coater. The slit-type die coater 1 has a block 101a, a block 101b, a side plate 101c (refer to FIG. 2), and a side plate 101d (refer to FIG. 2), which are fastened with bolts and the like.

A lip 103 has a back lip 103a and a front lip 103b. The lip 103 has a notch 102a, a groove 102b, a groove 102c, and a notch 102d (refer to FIG. 2). The notch 102a, the groove 102b, the groove 102c, and the notch 102d (refer to FIG. 2) provide non-coating portions, since no coating solution is ejected therefrom.

A numerical number 104 shows a slit formed between the block 101a and the block 101b. A numerical number 105 shows a portion called a manifold, in which a coating solution is temporarily stored, and to which a coating solution is fed from a coating solution supply pipe 106.

The viscosity of the coating solution is preferably not more than 4.0 mPa·s, and more preferably not more than 3.0 mPa·s, in view of functionality of a coating layer or coating thickness.

The viscosity of the coating solution is a value obtained by being measured at 25° C. employing an E-type viscometer VISCONIC MODEL ED and a controller E-200 produced by Told Sangyo Co., Ltd.

A coating solution, which is stored in the coating width direction in the manifold 105, passes through the slit 104 and is supplied from a slit outlet 104a at the tip of the slit 104 to a gap between the lip 103 and a belt-shaped substrate 3 supported on a backup roller 2. The supplied coating solution forms a bead Q, and is coated on the belt-shaped substrate 3 supported on the backup roller 2 to form a coating layer 4.

The slit outlet 104a has a slit outlet 104a1 (refer to FIG. 2), a slit outlet 104a2 (refer to FIG. 2) and a slit outlet 104a3 (refer to FIG. 2).

When coating is carried out, a pressure at the slit outlet in a bead formed from a coating solution supplied from the slit outlet 104a is negative or zero. When the pressure at the slit outlet is positive, the groove is filled with the coating solution ejected from the slit. The groove filled with the coating solution does not provide separate coating portions and does not form a coating layer in the stripe shape, which is undesirable.

In the invention, "a pressure being zero" implies that a pressure difference relative to atmospheric pressure is zero. However, in the invention, an error of ±0.001 MPa is within an allowance.

Further, "a pressure being negative" implies that the pressure is lower than that in the vicinity of the coater. However, when the pressure at the slit outlet is too lower than in the vicinity of the coater, the bead is difficult to form, and therefore, the pressure is preferably −0.01 MPa or higher. The pressure at the slit outlet in a bead of a coating solution supplied from the slit outlet 104a is determined according to the following method.

A pressure P in the manifold 105 is measured. The pressure P in the manifold can be measured with a pressure sensor AP-V80 produced by Keyence Co., Ltd.

When a coating solution is supplied with a flow rate at which the coating solution is supplied on coating, a pressure P in the manifold in the state supplied from the slit without coating is set as $P_0$, and a pressure P in the manifold during coating as $P_1$. Then, the pressure at the slit outlet in a bead of a coating solution ΔP can be determined according to the following formula.

$$\Delta P = P_1 - P_0$$

The pressure at the slit outlet can be adjusted by varying the viscosity of a coating solution used, a coating speed or a wet coating thickness.

A symbol A shows a coater gap, which is a clearance between the lip 103 (the back lip 103a and the front lip 103b) and the belt-shaped substrate 3 supported on a backup roller 2. The bead Q is formed at the coater gap A.

A symbol X shows a coating position where the coating solution supplied from the slit outlet 104a is coated on the belt-shaped substrate 3. When the coating position X is regarded as a boundary separating a position prior to coating from a position after coating, the position of the substrate 3 prior to coating is defined as an upstream side and the position of the substrate 3 with a coating film 4 formed after coating as a downstream side.

As is shown in this figure, the coating method employing the slit-type die coater 1 is one in which coating is carried out without providing a reduction chamber.

As is shown in this figure, a coating method employing a slit-type die coater 1 is one in which at the beginning of coating, the lip 103 (the back lip 103a and the front lip 103b) at the tip of the slit-type die coater 1 is moved from a standby position to a coating position by a moving means (not illustrated) in the state in which a necessary coating amount of a coating solution is supplied to the slit outlet and brought close to a belt-shaped substrate to form the bead Q in a gap (the coater gap A) between the lip tip and the belt-shaped substrate, thereby transferring the coating solution onto the belt-shaped substrate.

The coater gap A is preferably from 30 to 300 times the wet coating thickness in view of stability of a coating layer thickness distribution, stability of a coating layer width, vibration of a slit-type die coater or vibration due to transport of a belt-type substrate.

The coating speed is preferably from 0.1 to 10.0 m/minutes in view of influence of accompanying air or transporting stability. The coating speed herein referred to is a relative speed between the slit-type die coater and the substrate, and includes one in the case where the slit-type die coater is fixed and the substrate moves, one in the case where the substrate is fixed and the slit-type die coater moves, and one in the case where both the substrate and the slit-type die water move.

In this figure, the case where the slit-type die coater is fixed and the substrate moves is described, but the invention includes the case where the substrate is fixed and the slit-type die water moves or the case where both the substrate and the slit-type die coater move.

Next, FIG. 1b will be explained.

In FIG. 1b, symbols 4a through 4c show coating layers formed from the coating solutions ejected from the slit outlets 104a1 through 104a3 (refer to FIG. 2) of the slit-type die coater 1. The wet coating thicknesses of the coating layers 4a through 4c are preferably from 0.1 to 5.0 μm in view of coatability and cost.

The wet coating thickness implies a theoretical thickness computed from the following formula.

Wet coating thickness=Coating solution supply amount/(Coating layer width×Coating speed)

Symbols 5a through 5d show non-coating portions resulting from notches 102a through 102d (refer to FIG. 2).

As shown in this figure, when employing the slit-type die coater 1, a coating solution is coated on the belt-shaped substrate 3, non-coating portions 5a through 5d and coating layers 4a through 4c are alternately formed in the stripe shape in the conveyance direction (arrow direction in the figure) of the belt-shaped substrate 3.

In the invention, the coating region in the coating width direction refers to a region from coating 4a to coating 4c, except for non-coating portions 5a and 5d.

The present invention relates to a method of forming a thin layer in the stripe shape employing a coating solution with a low viscosity.

Figure 2A:
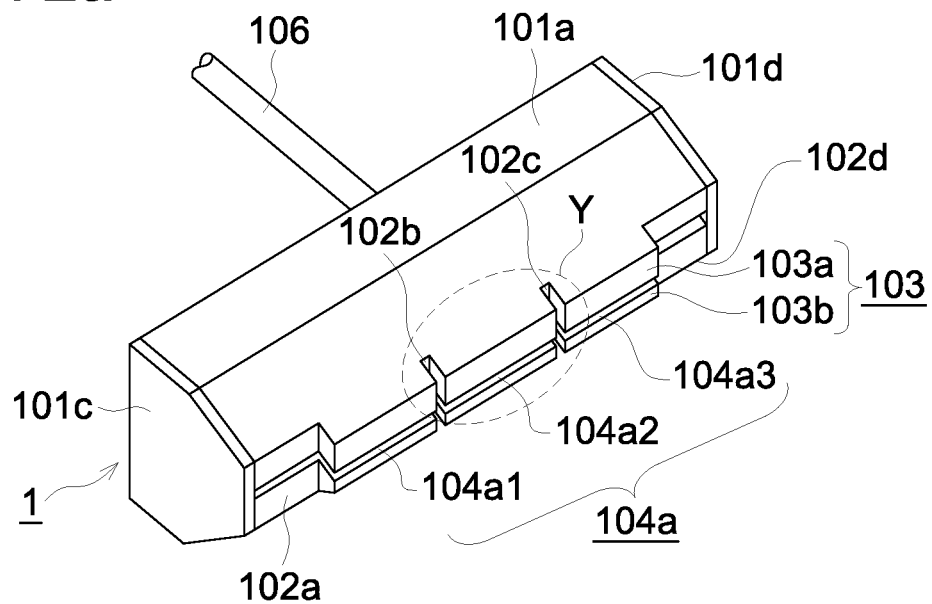
FIG. 2 is a schematic view of a slit-type die coater as shown in FIG. 1.
Figure 2B:
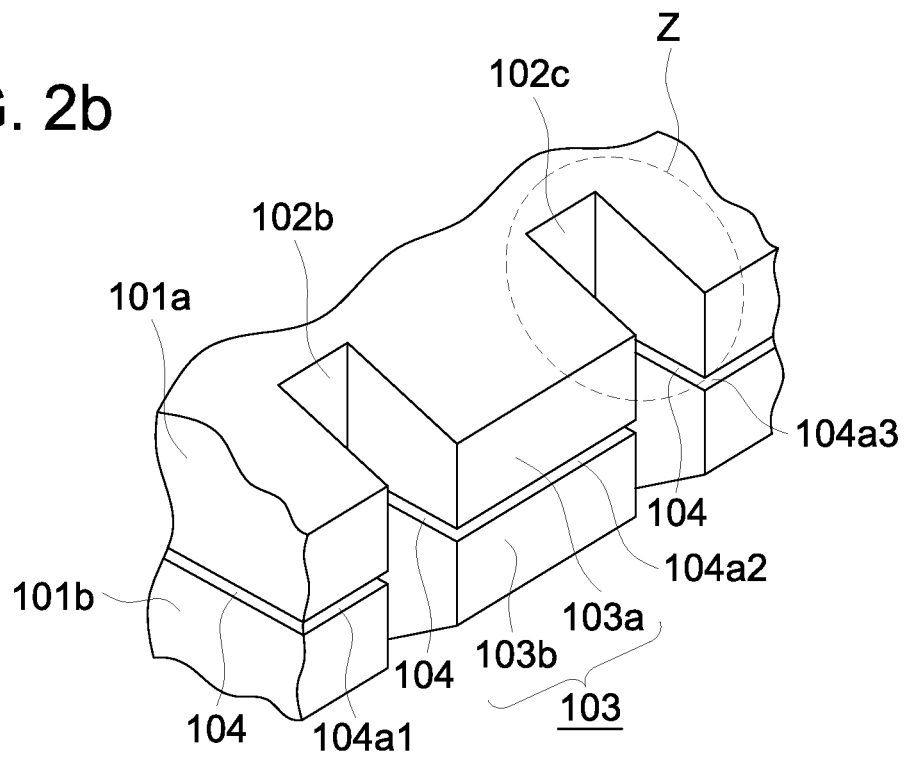

FIG. 2 is a schematic view of a slit-type die coater as shown in FIG. 1. FIG. 2a is a schematic perspective view of a slit-type die coater as shown in FIG. 1. FIG. 2b is an enlarged schematic perspective view of a portion as shown by Y in FIG. 1.

In the figure, a numerical number 1 shows a slit-type die coater. Symbols 102a and 102d show notches provided at the both edges in the coating width direction at the tip of the lip 103. Symbols 102b and 102c show grooves provided within the coating width at the tip of the lip 103.

The notch 102a is provided in the back lip 103a and the front lip 103b at the same position in the coating width direction, and the slit 104 is formed between the block 101a and the block 101b. The notch 102d also has the same structure as above.

The groove 102b is provided in the back lip 103a and the front lip 103b at the same position in the coating width direction, and the slit 104 is formed between the block 101a and the block 101b. The groove 102c also has the same structure as above.

Symbol 104a1 shows a slit outlet at the tip of the slit 104 (refer to FIG. 1) provided between the notch 102a and the groove 102b. The coating solution ejected from the slit outlet 104a1 forms a coating layer 4a (refer to FIG. 1).

Symbol 104a2 shows a slit outlet at the tip of the slit 104 (refer to FIG. 1) provided between the groove 102b and the groove 102c. The coating solution ejected from the slit outlet 104a2 forms a coating layer 4b (refer to FIG. 1).

Symbol 104a3 shows a slit outlet at the tip of the slit 104 (refer to FIG. 1) provided between the groove 102c and the notch 102d. The coating solution ejected from the slit outlet 104a3 forms a coating layer 4c (refer to FIG. 1).

The slit-type die coater 1 as shown in this figure is constructed so that the coating layer 4 (refer to FIG. 1) is divided into three by the notch 102a, the groove 102b, the groove 102c and the notch 102d, which are provided in the coating width direction of the tip of the lip 102. Other symbols are the same as those as noted in FIG. 1.

The number of grooves at the tip of the lip can be suitably selected due to the substrate width, the width of non-coating portions, the width of coating portions, or the number of coating portions. The number of the slit outlets can be increased or decreased due to the number of grooves, and can be optionally selected.

When a coating solution with a viscosity of not more than 4.0 mPa·s is coated under increased pressure employing the slit-type die coater 1, the coating solution flows out not only from each of the slit outlets 104a1, 104a2 and 104a3 but also from the slit 104 at each of the notch 102a, the groove 102b, the groove 102c and the notch 102d. As a result, it is difficult to conduct coating such that a coating solution is divided by the notch 102a, the groove 102b, the groove 102c and the notch 102d to form coating layers in the stripe shape.

When a coating solution with a viscosity of not more than 4.0 mPa·s is coated without applying pressure, employing the slit-type die coater 1, the coating solution flows out from each of the slit outlets 104a1, 104a2 and 104a3 and forms a bead between the belt-shaped substrate and each of the slit outlets, whereby coating proceeds.

Figure 3A:
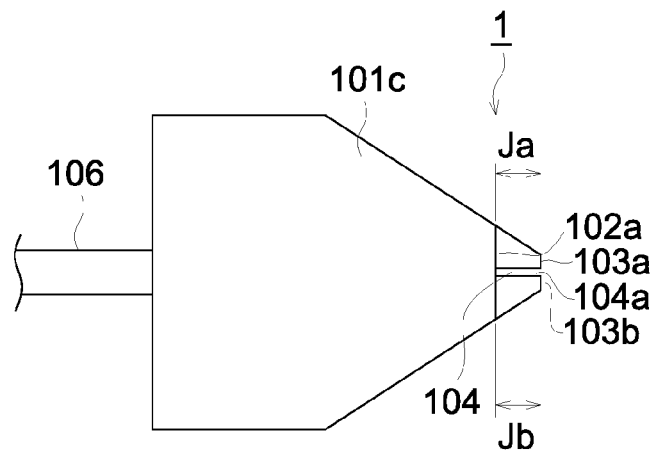
FIG. 3 is an enlarged schematic view of a slit-type die coater shown in FIG. 2.
Figure 3B:
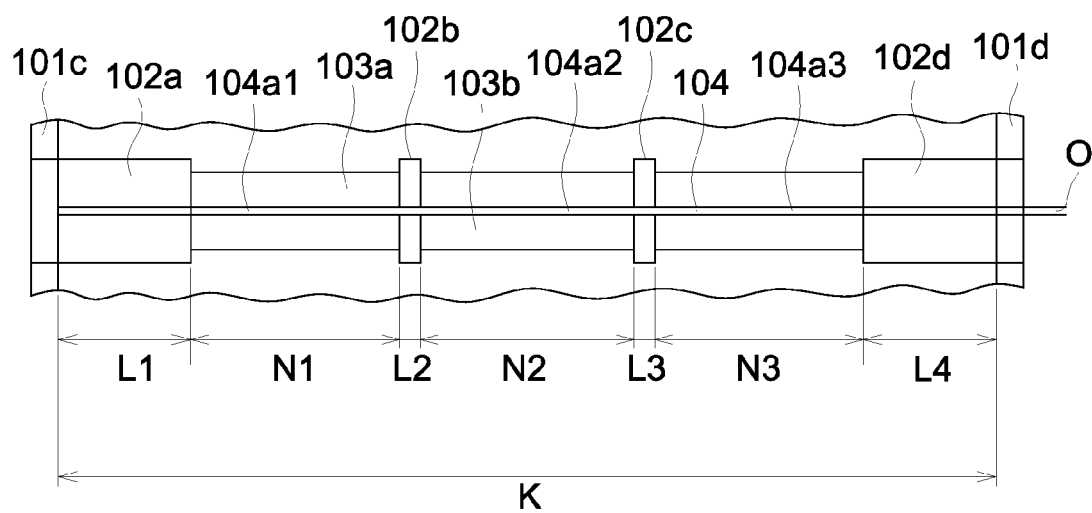

FIG. 3 is an enlarged schematic view of a slit-type die coater shown in FIG. 2. FIG. 3a is an enlarged schematic side view of a slit-type die coater shown in FIG. 2. FIG. 3b is an enlarged schematic front view of a slit-type die coater shown in FIG. 2.

In the figure, symbol Ja shows a depth from the back lip 103a of the notch 102a. The depth Ja is preferably from 1.0 to 10.0 mm, in view of coating solution shortage, cross-linking ability of a coating solution with the substrate and with the lip or coating solution leakage in the width direction of the slit-type die coater. The depth Ja is more preferably from 1.5 to 5.0 mm. Further, preferred depth from the back lip 103a of the groove 102b, the groove 102c and the notch 102d is the same as the depth Ja.

Symbol Jb shows a depth from the front lip 103b of the notch 102a. The depth Jb is preferably from 1.0 to 10.0 mm, in view of coating solution shortage, cross-linking ability of a coating solution with the substrate and with the lip or coating solution leakage in the width direction of the slit-type die coater. The depth Jb is more preferably from 1.5 to 5.0 mm. Further, preferred depth from the front lip 103b of the groove 102b, the groove 102c and the notch 102d is the same as the depth Jb.

Symbol K shows a width of the slit-type die coater 1. The width K can be suitably varied independently of a coating width.

Symbol L1 shows a width of the notch 102a in the coating width direction of the lip 103. The width L1 can be suitably determined considering a relationship between the width of the slit-type die coater 1 and a coating width.

Symbol L2 shows a width of the groove 102b in the coating width direction of the lip 103. The minimum of the width L2 is preferably 0.5 mm and the maximum of the width L2, although suitable determined due to the width of a coating stripe, is preferably 15 mm or less.

Symbol L3 shows a width of the groove 102c in the coating width direction of the lip 103. The minimum of the width L3 is preferably 0.5 mm and the maximum of the width L3, although suitable determined due to the width of a coating stripe, is preferably 15 mm or less. The width L2 and the width L3 may be the same or different.

Symbol L4 shows a width of the notch 102d in the coating width direction of the lip 103. The width L4 can be suitably determined, considering a relationship between the width of the slit-type die coater 1 and a coating width. The width L1 and the width L4 may be the same or different. The width L1 or L2 is preferably smaller, and may be absent.

Symbol N1 shows a width in the coating width direction of the slit outlet 104a1 at the tip of the slit 104. Symbol N2 shows a width in the coating width direction of the slit outlet 104a2 at the tip of the slit 104.

Symbol N3 shows a width in the coating width direction of the slit outlet 104a3 at the tip of the slit 104.

The widths N1 through N3 can be suitably varied to be in accordance with a coating width, and may be the same as or different from each other.

Symbol O shows a slit clearance of the slit 104. The slit clearance O is preferably from 5 to 50 μm, considering a coating solution supply amount, physical properties of a coating solution or the like. Other symbols are the same as denoted in FIG. 1.

The notch 102a, the groove 102b, the groove 102c, and the notch 102d are arranged in the front lip 103b and the back lip 103a at substantially the same position, respectively.

FIG. 4 is an enlarged schematic plan view of a portion shown by Z in FIG. 2b showing the shape of a groove. This figure is an enlarged schematic plan view from the side of the block 101a constituting the slit-type die coater 1 as shown in FIG. 2.

In the figure, symbol C shows a plane of the groove 102b parallel to the lip 103, symbol B shows a first slope of the groove 102b connecting the plane C with the lip 103, and symbol D shows a second slope of the groove 102b connecting the plane C with the lip 103. An angle θ shows an angle formed between the first slope B and the plane C. The shape of the groove is not specifically limited, and typical examples thereof include those as shown in FIG. 4a through FIG. 4e.

Figure 4A:
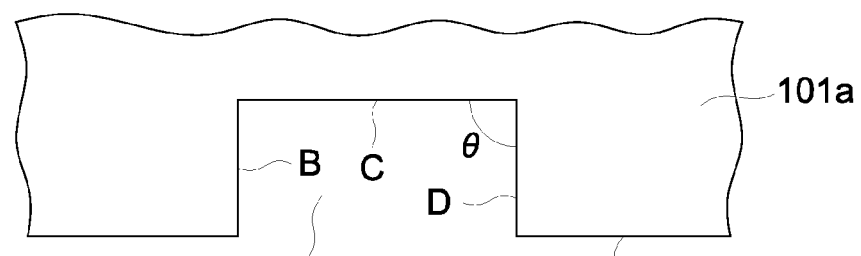
FIG. 4 is an enlarged schematic plan view of a portion shown by Z in FIG. 2.

FIG. 4a shows an example in which an angle θ formed between the second slope D and the plane C is 90°. It is preferred that an angle formed between the first slope B and the plane C is the same as an angle formed between the second slope D and the plane C.

Figure 4B:
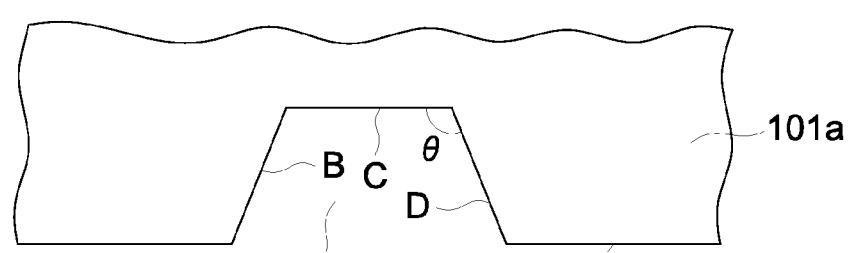

FIG. 4b shows an example in which an angle θ formed between the second slope D and the plane C is an obtuse angle. It is preferred that an angle formed between the first slope B and the plane C is the same as an angle formed between the second slope D and the plane C.

Figure 4C:
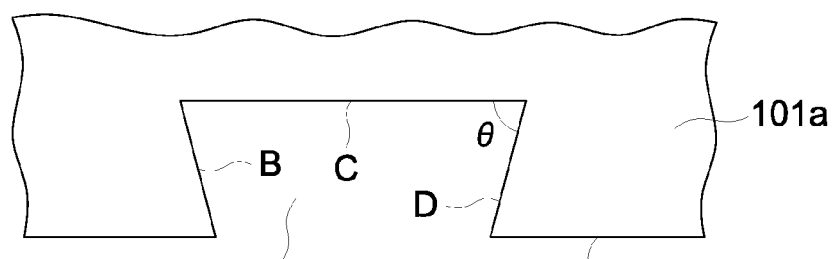

FIG. 4c shows an example in which an angle θ formed between the second slope D and the plane C is an acute angle. It is preferred that an angle formed between the first slope B and the plane C is the same as an angle formed between the slope plane D and the plane C.

Figure 4D:
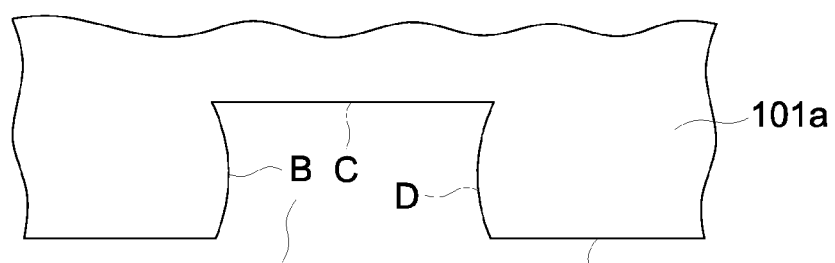

FIG. 4d shows an example in which the second slope D is a convex surface. It is preferred that the first slope B is the same convex surface as the second slope D.

Figure 4E:
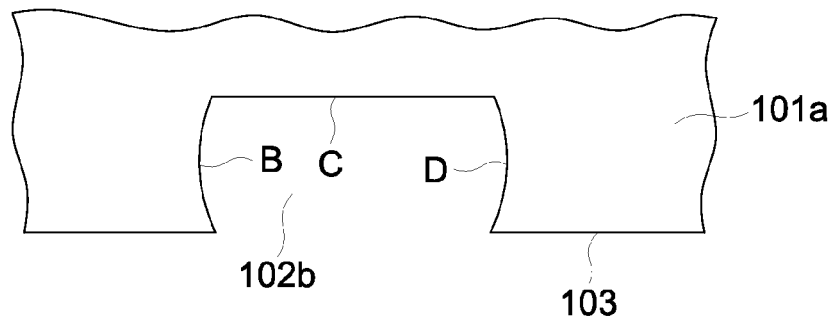

FIG. 4e shows an example in which the second slope D is a concave surface. It is preferred that the first slope B is the same concave surface as the slope plane D.

The notch 102a (102d) (refer to FIG. 2), which is provided on each of the both edges in the coating width direction of the lip 103, has a slope connecting the plane parallel to the lip 103 with the lip 103. It is preferred that the slope of the notch 102a (102d) is the same shape as the slope D of the groove 102b.

The portion at which the plane C intersects the second slope D may be subjected to an R chamfering processing. It is preferred that the portion at which the second slope D intersects the lip 103 is a sharp edge.

It is preferred that the portion at which the slope of the notch 102a (102d) (refer to FIG. 2) provided on each of both edges in the coating width direction of the lip 103 intersects the lip 103 is also a sharp edge.

A coating method in which coating is carried out at a coating solution pressure at the lip tip being negative or zero employing the slit-type die coater as shown in FIGS. 1 through 4 having at least one groove in the lip in a coating area in a coating width direction can form a coating layer in the stripe shape with a wet coating thickness of from 0.1 to 5.0 μm at a stable coating layer thickness, and can fill a need in the market.

The coating method of the invention employing the slit-type die coater as shown in FIGS. 1 through 4 can be applied to manufacture of a hard coat layer, an anti-reflection layer, a functional layer capable of forming according to a coating method of layers constituting an organic EL element (for example, a hole transport layer, a light emission layer, etc.), or a color filter, an optical filter, various coating films employed in a liquid crystal display.

As the materials used in the manufacture of an anti-reflection film or an optical film employing the coating method of the invention, there are mentioned known materials disclosed in Japanese Patent O.P.I. Publication Nos. 2008-296421, 2008-242003, 2008-224718, 2008-200600, 2007-098833, 2006-293201, and 2006-285217.

As the materials used in the manufacture of an organic EL element employing the coating method of the invention, there are mentioned known materials disclosed in Japanese Patent O.P.I. Publication Nos. 2006-294536, and 2007-73332.

EXAMPLES

Next, the present invention will be explained employing examples, but the invention is not specifically limited thereto. In the examples, "part" or "parts" represents "part by mass" or "parts by mass", respectively, unless otherwise specified.

Example 1

Preparation of Strip-Shaped Substrate

A belt-shaped substrate, a polyethylene terephthalate film with a thickness of 100 μm, a width of 330 mm and a length of 500 m (produced by Teijin Dupont Films Co. Ltd., hereinafter abbreviated as PET) was provided as a substrate.
(Preparation of Coating Solutions)

Coating solutions in which 1.5 parts by mass of a commercially available dye, C.I. Acid Red 249 are dissolved in 100 parts by mass of acetone were prepared, the viscosity thereof being adjusted varying addition amount of polyvinyl butyrate (PVB) as shown in Table 1. The viscosity of the solutions were measured at 25° C., employing an E Type viscometer VISCONIC MODELED and a controller E-200 TYPE each produced by Told Sangyo Co., Ltd, which are shown in Table 1.
(Provision of Slit-Type Die Coater)

A slit-type die coater was provided which had a dimension of each part as shown in FIG. 2 and notches and grooves as shown in FIG. 3.

| | |
|---|---|
| Width K of slit type die coater | 330 mm |
| Depth Jb of notches and grooves from the front lip | 2 mm |
| Depth Ja of notches and grooves from the back lip | 2 mm |

-continued

| | |
|---|---|
| Width L1 of notch 102a of lip in the coating width direction | 15 mm |
| Width L2 of groove102b of lip in the coating width direction | 3 mm |
| Width L3 of groove102c of lip in the coating width direction | 3 mm |
| Width L4 of notch102d of lip in the coating width direction | 15 mm |
| Width N1 of slit outlet 104a1 in the coating width direction | 98 mm |
| Width N2 of slit outlet 104a1 in the coating width direction | 98 mm |
| Width N3 of slit outlet 104a1 in the coating width direction | 98 mm |
| Slit gap O | 20 μm |
| Coating width | 300 mm |

The shapes of the notches and grooves were those as shown in FIG. 4a.

(Coating)

The coating solution prepared was coated on the belt-shaped substrate without a pressure reduction chamber to form three coating layers in the stripe shape as shown in FIG. 1 under the following conditions, varying a wet coating thickness and viscosity of the coating solution and adjusting pressure at the slit outlet of the coating solution bead, as shown in Table 1, and dried. Thus, sample Nos. 101 through 128 were prepared.

When the samples Nos. 101 through 128 were prepared, the pressure at the outlet of the slit of the coating solution bead supplied from the slit outlet is one measured according to the method as described in the present Specification. The wet coating thickness was adjusted by varying a supply amount of the coating solution.

The wet coating thickness implies a theoretical thickness computed by the following formula.

Wet coating thickness=Coating solution supply amount/(Coating width×Coating speed)

With respect to dry coating thickness, the dry coating thicknesses at three points in the width direction and five points in the length direction of each coating in the stripe shape were measured and the average thereof was defined as the dry coating thickness.

(Coating Conditions)

As the coating conditions, the coating width was 300 mm, the coating length was 50 m, the coating temperature was 25° C. during coating, and the coating speed was 5 m/minute. The coating speed was measured according to a Laser Doppler Velocity Meter LV203 produced by Mitsubishi Denki Co., Ltd.

TABLE 1

| Sample No. | Wet Coating Thickness (μm) | Coater Gap (μm) | Coater Gap Clearance to Wet Coating Thickness (Magnification Rate) | Pressure at Slit Outlet of Beads (MPa) | Viscosity of Coating Solution (mPa · s) |
|---|---|---|---|---|---|
| 101 | 0.08 | 24 | 300 | +0.002 | 20 |
| 102 | 0.08 | 24 | 300 | ±0.0 | 10 |
| 103 | 0.08 | 24 | 310 | −0.01 | 1 |
| 104 | 0.08 | 24 | 300 | −0.015 | 0.4 |
| 105 | 0.1 | 30 | 300 | +0.002 | 20 |
| 106 | 0.1 | 30 | 300 | ±0.0 | 10 |
| 107 | 0.1 | 30 | 300 | −0.01 | 1 |
| 108 | 0.1 | 30 | 300 | −0.015 | 0.4 |
| 109 | 0.5 | 150 | 300 | +0.002 | 20 |
| 110 | 0.5 | 150 | 300 | ±0.0 | 10 |
| 111 | 0.5 | 150 | 300 | −0.01 | 1 |
| 112 | 0.5 | 150 | 300 | −0.015 | 0.4 |
| 113 | 1.0 | 300 | 300 | +0.002 | 20 |
| 114 | 1.0 | 300 | 300 | ±0.0 | 10 |
| 115 | 1.0 | 300 | 300 | −0.01 | 1 |
| 116 | 1.0 | 300 | 300 | −0.015 | 0.4 |
| 117 | 3.0 | 300 | 100 | +0.002 | 15 |
| 118 | 3.0 | 300 | 100 | ±0.0 | 5 |
| 119 | 3.0 | 300 | 100 | −0.01 | 1 |
| 120 | 3.0 | 300 | 100 | −0.015 | 0.4 |
| 121 | 5.0 | 300 | 60 | +0.002 | 12 |
| 122 | 5.0 | 300 | 60 | ±0.0 | 5 |
| 123 | 5.0 | 300 | 60 | −0.01 | 1 |
| 124 | 5.0 | 300 | 60 | −0.015 | 0.4 |
| 125 | 6.0 | 300 | 50 | +0.002 | 12 |
| 126 | 6.0 | 300 | 50 | ±0.0 | 5 |
| 127 | 6.0 | 300 | 50 | −0.01 | 1 |
| 128 | 6.0 | 300 | 50 | −0.015 | 0.4 |

Evaluation

With respect to each of Sample Nos. 101 through 128, the leading 5 m long portion and the tail 5 m long portion were taken out and determined for stability of the coating thickness and coating width of each coating in the stripe shape according to the method as described below, and evaluated according to the evaluation criteria as described below. The results are shown in Table 2.

Determination of Stability of Coating Thickness

Since there are a linear relationship between density and coating thickness, densities were measured at an interval of 10 mm in the width direction employing Konica densitometer PDM-7 produced by Konica Minolta Co. Ltd. Thus, densities at thirty points of each sample were measured, and the variation thereof was determined according to the following formula and evaluated as a measure of stability of coating thickness.

Stability (Variation) of Coating Thickness=((Maximum density−Minimum density)/Average density)×100

Evaluation Criteria
A: The variation is less than 1.0.
B: The variation is from 1.0 to less than 3.0.
C: The variation is from 3.0 to less than 5.0.
D: The variation is not less than 5.0.
Determination of Stability of Coating Width Coating widths were measured at an interval of 1 m in the longitudinal direction, employing a microscope MF-A4020 produced by Mitsutoyo Co. Ltd. Thus, widths at ten points of each sample were measured, and the variation thereof was determined according to the following formula and evaluated as a measure of stability of coating width.

Stability (Variation) of Coating Width=((Maximum width−Minimum width)/Average width)×100

Evaluation Criteria
A: The variation is less than 1.0.
B: The variation is from 1.0 to less than 3.0.
C: The variation is from 3.0 to less than 5.0.
D: The variation is not less than 5.0.

TABLE 2

| Sample No. | Stability of Thickness | | | Stability of Coating Width | | | Remarks |
|---|---|---|---|---|---|---|---|
| | First Stripe | Second Stripe | Third Stripe | First Stripe | Second Stripe | Third Stripe | |
| 101 | D | D | D | D | D | D | Comparative |
| 102 | C | C | C | C | C | C | Inventive |
| 103 | C | C | C | C | C | C | Inventive |
| 104 | C | C | C | C | C | C | Inventive |
| 105 | D | D | D | D | D | D | Comparative |
| 106 | C | C | C | C | C | C | Inventive |
| 107 | A | A | A | A | A | A | Inventive |
| 108 | B | B | B | B | B | B | Inventive |
| 109 | D | D | D | D | D | D | Comparative |
| 110 | C | C | C | C | C | C | Inventive |
| 111 | A | A | A | A | A | A | Inventive |
| 112 | B | B | B | B | B | B | Inventive |
| 113 | D | D | D | D | D | D | Comparative |
| 114 | C | C | C | C | C | C | Inventive |
| 115 | A | A | A | A | A | A | Inventive |
| 116 | B | B | B | B | B | B | Inventive |
| 117 | D | D | D | D | D | D | Comparative |
| 118 | C | C | C | C | C | C | Inventive |
| 119 | A | A | A | A | A | A | Inventive |
| 120 | B | B | B | B | B | B | Inventive |
| 121 | D | D | D | D | D | D | Comparative |
| 122 | C | C | C | C | C | C | Inventive |
| 123 | A | A | A | A | A | A | Inventive |
| 124 | B | B | B | B | B | B | Inventive |
| 125 | D | D | D | D | D | D | Comparative |
| 126 | C | C | C | C | C | C | Inventive |
| 127 | C | C | C | C | C | C | Inventive |
| 128 | C | C | C | C | C | C | Inventive |

It has proved that Sample Nos. 102 through 104, 106 through 108, 110 through 112, 114 to 116, 116 to 118, 118 to 120, 122 to 124, and 126 to 128 exhibit good stability of both thickness and coating width, which were prepared according to a coating method in which employing a slit-type die coater No. 1 having at least one groove in the coating region in the coating width direction of the lip tip, the coating solution was coated on the belt-shaped substrate at a coating speed of 5 m/minute at a pressure at the slit outlet of the coating beads being negative or zero to form three stripes of coatings, and Sample Nos. 106 through 108, 110 through 112, 114 to 116, 118 to 120, and 122 to 124 exhibit especially excellent stability of both thickness and coating width, which were prepared so that the wet coating thickness of the coatings formed on the belt-shaped substrate was from 0.1 to 5.0 μm. It has proved that as compared with inventive samples, Sample Nos. 101, 105, 109, 113, 117 121 and 125 exhibit poor stability of both thickness and coating width, which were prepared according to a coating method in which employing a slit-type die coater having at least one groove in the coating region in the coating width direction of the lip tip, the coating was carried out at a pressure at the slit outlet of the coating beads falling outside the range in the invention.

Further, when employing the same coater as above, coating was carried out at a pressure at the slit outlet of the beads being +0.03 MPa and at a wet coating thickness of 5 μm, which corresponds to a method disclosed in the Patent document 1, too a large coater gap exhibited poor stability of the coating thickness and the coating width in the stripe-shaped coating, and too a small coater gap resulted in incapability of forming a stripe-shaped coating layer.

Further, when a slit-type die coater was employed in which shim was inserted for separation of the coatings, no stripe-shaped coatings were formed. As is apparent from the aforementioned, the usefulness of the invention has been evidenced.

Example 2

Preparation of Strip-Shaped Substrate

A belt-shaped substrate, a polyethylene terephthalate film with a thickness of 100 μm, a width of 330 mm and a length of 500 m (produced by Teijin Dupont Films Co. Ltd., hereinafter abbreviated as PET) was provided as a substrate.
(Preparation of Coating Solutions)

Coating solutions in which 1.5 parts by mass of a commercially available dye, C.I. Acid Red 249 are dissolved in 100 parts by mass of acetone were prepared, the viscosity thereof being adjusted varying addition amount of polyvinyl butyrate (PVB). Thus, the coating solutions Nos. a to e having a different viscosity were prepared as shown in Table 3. The viscosities of the solutions were measured in the same manner as in Example 1, and are shown in Table 3.

TABLE 3

| Coating Solution No. | Viscosity (mPa · s) |
|---|---|
| a | 0.3 |
| b | 1.0 |
| c | 3.0 |
| d | 4.0 |
| e | 5.0 |

(Provision of Slit-Type Die Coater)
The same slit-type die coater as that provided in Example 1 was provided.
(Coating)

The coating solution Nos. a through e prepared were coated on the belt-shaped substrate at a wet coating thickness of 2.0 μm under the following conditions without a pressure reduction chamber to form three coating layers in the stripe shape as shown in FIG. 1, and dried. Thus, Sample Nos. 201 through 205 as shown in table 4 were prepared. The wet coating thickness was measured in the same manner as in Example 1.
(Coating Conditions)

As the coating conditions, the coating width was 300 mm, the coating length was 50 m, the coating temperature was 25° C. during coating, the coater gap was 200 μm which was 100 times the wet coating thickness, and the coating speed was 5 m/minute. The coating speed was measured in the same manner as in Example 1. The pressure at the slit outlet of the coating solution bead supplied from the slit outlet was −0.003 MPa. The pressure was measured in the same manner as in Example 1.

tion, and widths N1, N2 and N3 of the slit outlet in the coating width direction were changed to those as shown in Table 5. Thus, slit-type die coater Nos. 3-1 through 3-6 were prepared.

TABLE 5

| Slit-type Die Coater No. | Width of Groove of Lip in the Coating Width Direction (mm) L2, L3 | Width of Notch of Lip in the Coating Width Direction (mm) L1, L4 | Widths of Slit Outlet in the Coating Width Direction (mm) | | |
|---|---|---|---|---|---|
| | | | N1 | N2 | N3 |
| 3-1 | 0.4 | 15.0 | 89.73 | 89.73 | 89.73 |
| 3-2 | 0.5 | 15.0 | 89.67 | 89.67 | 89.67 |
| 3-3 | 1.0 | 15.0 | 89.33 | 89.33 | 89.33 |
| 3-4 | 3.0 | 15.0 | 88.0 | 88.0 | 88.0 |
| 3-5 | 15.0 | 15.0 | 80.0 | 80.0 | 80.0 |
| 3-6 | 16.0 | 15.0 | 79.33 | 79.33 | 79.33 |

Evaluation

With respect to each of Sample Nos. 201 through 205, the leading 5 m long portion and the tail 5 m long portion were taken out and determined for stability of the coating thickness and coating width according to the same method as Example 1, and evaluated according to the same evaluation criteria as Example 1. The results are shown in Table 4.

TABLE 4

| Sample No. | Coating Solution No. | Stability of Coating Thickness | | | Stability of Coating Width | | | Remarks |
|---|---|---|---|---|---|---|---|---|
| | | First Stripe | Second Stripe | Third Stripe | First Stripe | Second Stripe | Third Stripe | |
| 201 | a | A | A | A | A | A | A | Invention |
| 202 | b | A | A | A | A | A | A | Invention |
| 203 | c | A | A | A | A | A | A | Invention |
| 204 | d | B | B | B | B | B | B | Invention |
| 205 | e | C | C | C | C | C | C | Invention |

It has proved that when employing a slit-type die coater having at least one groove in the coating region in the coating width direction of the lip tip, the coating solution was coated on the belt-shaped substrate at a coating speed of not more than 10 m/minute and at a pressure at the slit outlet of the coating solution bead being negative or zero, so that the wet coating thickness of the coating formed on the belt-shaped substrate is from 0.1 to 5.0 μm, the coater gap being from 30 to 300 times the wet coating thickness, the coating solution having a viscosity of not more than 4.0 mPa·s exhibits particularly excellent stability of both coating thickness and coating width. Thus, the usefulness of the invention has been confirmed.

Example 3

Preparation of Strip-Shaped Substrate

The same belt-shaped substrate as Example 1 was prepared as the substrate.
(Preparation of Coating Solution)
The same coating solution as coating solution No. b used in Example 2 was prepared.
(Preparation of Slit-Type Die Coater)
The same slit-type die coater as provided in Example 1 was provided, except that width L1 of notch of lip in the coating width direction, width L2 of groove of lip in the coating width direction, width L3 of groove of lip in the coating width direction, width L4 of notch of lip in the coating width direc- (Coating)
Employing the slit-type die coater Nos. 3-1 through 3-6, the coating solution prepared was coated on the belt-shaped substrate at a wet coating thickness of 2.0 μm under the following conditions without a pressure reduction chamber to form three coating layers in the stripe shape as shown in FIG. 1, and dried. Thus, Sample Nos. 301 through 306 as shown in Table 6 were prepared. The wet coating thickness was measured in the same manner as in Example 1.
(Coating Conditions)
As the coating conditions, the coating width was 300 mm, the coating length was 50 m, the coating temperature was 25° C. during coating, the coater gap was 200 μm which was 100 times the wet coating thickness, and the coating speed was 5 m/minute. The coating speed was measured in the same manner as in Example 1. The pressure at the slit outlet of the coating solution bead supplied from the slit outlet was −0.003 MPa. The pressure was measured in the same manner as in Example 1.
Evaluation With respect to each of Sample Nos. 301 through 206, the leading 5 m long portion and the tail 5 m long portion were extracted for evaluation, and each coating in the stripe shape was determined for stability of the coating thickness and coating width according to the same method as Example 1, and evaluated according to the same evaluation criteria as in Example 1. The results are shown in Table 6.

TABLE 6

| Sample No. | Slit-type Die Coater No. | Stability of Coating Thickness | | | Stability of Coating Width | | | Remarks |
|---|---|---|---|---|---|---|---|---|
| | | First Stripe | Second Stripe | Third Stripe | First Stripe | Second Stripe | Third Stripe | |
| 301 | 3-1 | A | A | A | C | C | C | Invention |
| 302 | 3-2 | A | A | A | A | A | A | Invention |
| 303 | 3-3 | A | A | A | A | A | A | Invention |
| 304 | 3-4 | A | A | A | A | A | A | Invention |
| 305 | 3-5 | A | A | A | A | A | A | Invention |
| 306 | 3-6 | B | B | B | B | B | B | Invention |

It has proved that when employing a slit-type die coater comprising the notches and grooves provided in the coating region in the coating width direction of the lip, the notches and grooves each having a depth of 2 mm and the notches having a width in the coating width direction of 15.0 mm, the coating solution is coated on the belt-shaped substrate at a coating solution viscosity of not more than 4.0 mPa·s, at a coater gap which is from 30 to 300 times the wet coating thickness, at a coating speed of not more than 10 m/minute and at a pressure at the slit outlet of the coating beads being negative or zero, so that the wet coating thickness of a coating layer formed on the belt-shaped substrate is from 0.1 to 5.0 μm, the groove width in the width direction of the lip being from 0.5 to 15.0 mm exhibits particularly excellent stability of both coating thickness and coating width. Thus, the usefulness of the invention has been confirmed.

Example 4

Preparation of Strip-Shaped Substrate

The same belt-shaped substrate as Example 1 was prepared as the substrate.
(Preparation of Coating Solution)
The same coating solution as coating solution No. b used in Example 2 was prepared.
(Preparation of Slit-Type Die Coater)
The same slit-type die water as prepared in Example 1 was prepared, except that the depth of the notches and the depth of the grooves were changed to those as shown in Table 7. Thus, slit-type die water Nos. 4-1 through 4-6 were prepared.

TABLE 7

| Slit-type Die Coater No. | Depths of Notches and Grooves (mm) |
|---|---|
| 4-1 | 0.8 |
| 4-2 | 1.0 |
| 4-3 | 2.0 |
| 4-4 | 5.0 |
| 4-5 | 10.0 |
| 4-6 | 11.0 |

(Coating)

Employing the slit-type die coater Nos. 4-1 through 4-6, the coating solution prepared was coated on the belt-shaped substrate at a wet coating thickness of 2.0 μm under the following conditions without a pressure reduction chamber to form three coating layers in the stripe shape as shown in FIG. 1, and dried. Thus, Sample Nos. 401 through 406 as shown in Table 8 were prepared. The wet coating thickness was measured in the same manner as in Example 1.
(Coating Conditions)

As the coating conditions, the coating width was 300 mm, the coating length was 50 m, the coating temperature was 25° C. during coating, the water gap was 200 μm which was 100 times the wet coating thickness, and the coating speed was 5 m/minute. The coating speed was measured in the same manner as in Example 1. The pressure at the slit outlet of the coating solution bead supplied from the slit outlet was –0.003 MPa. The pressure was measured in the same manner as in Example 1.
Evaluation With respect to each of Sample Nos. 401 through 406, the leading 5 m long portion and the tail 5 m portion were extracted as specimens for evaluation, and each of the coating layers in the stripe shape was determined for stability of the coating thickness and coating width according to the same method as Example 1, and evaluated according to the same evaluation criteria as in Example 1. The results are shown in Table 8.

TABLE 8

| Sample No. | Slit-type Die Coater No. | Stability of Coating Thickness | | | Stability of Coating Width | | | Remarks |
|---|---|---|---|---|---|---|---|---|
| | | First Stripe | Second Stripe | Third Stripe | First Stripe | Second Stripe | Third Stripe | |
| 401 | 4-1 | A | A | A | C | C | C | Invention |
| 402 | 4-2 | A | A | A | A | A | A | Invention |
| 403 | 4-3 | A | A | A | A | A | A | Invention |
| 404 | 4-4 | A | A | A | A | A | A | Invention |
| 405 | 4-5 | A | A | A | A | A | A | Invention |
| 406 | 4-6 | B | B | B | A | A | A | Invention |

It has proved that when employing a slit-type die coater comprising the notches and grooves each provided in the coating region in the coating width direction of the lip, the notches and grooves each having a width in the coating width direction of 3 mm, the coating solution is coated on the belt-shaped substrate at a coating solution viscosity of not more than 4.0 mPa·s, at a coater gap which is from 30 to 300 times the wet coating thickness, at a coating speed of not more than 10 m/minute and at a pressure at the slit outlet of the coating beads being negative or zero, so that the wet coating thickness of a coating layer formed on the belt-shaped substrate is from 0.1 to 5.0 μm, the depth of the notches and the grooves of from 1.0 to 10.0 mm exhibits particularly excellent stability of both coating thickness and coating width. Thus, the usefulness of the invention has been confirmed.

Example 5

Preparation of Strip-Shaped Substrate

The same belt-shaped substrate as Example 1 was prepared as the substrate.
(Preparation of Coating Solution)
The same coating solution as coating solution No. b used in Example 2 was prepared.
(Preparation of Slit-Type Die Coater)
The same slit-type die coater as prepared in Example 1 was prepared.
(Coating)

Employing the slit-type die coater, the coating solution prepared was coated on the belt-shaped substrate without a pressure reduction chamber, changing the coater gap and the wet coating thickness as shown in Table 9 to form three coating layers in the stripe shape as shown in FIG. 1, and dried. Thus, Sample Nos. 501 through 520 were prepared. The wet coating thickness was measured in the same manner as in Example 1.
(Coating Conditions)

As the coating conditions, the coating width was 300 mm, the coating length was 50 m, the coating temperature was 25° C. during coating, and the coating speed was 5 m/minute. The coating speed was measured in the same manner as in Example 1. The pressure at the slit outlet of the coating solution bead supplied from the slit outlet was –0.003 MPa. The pressure was measured in the same manner as in Example 1.

TABLE 9

| Sample No. | Wet Coating Thickness (μm) | Ratio of Coater Gap to Wet Coating Thickness (Magnification) | Coater Gap (μm) |
|---|---|---|---|
| 501 | 0.07 | 21 | 1.5 |
| 502 | 0.07 | 43 | 3.0 |

TABLE 9-continued

| Sample No. | Wet Coating Thickness (μm) | Ratio of Coater Gap to Wet Coating Thickness (Magnification) | Coater Gap (μm) |
|---|---|---|---|
| 503 | 0.07 | 285 | 20.0 |
| 504 | 0.07 | 357 | 25.0 |
| 505 | 0.10 | 20 | 2.0 |
| 506 | 0.10 | 30 | 3.0 |
| 507 | 0.10 | 300 | 30.0 |
| 508 | 0.10 | 400 | 35.0 |
| 509 | 3.0 | 20 | 60.0 |
| 510 | 3.0 | 30 | 90.0 |
| 511 | 3.0 | 300 | 900.0 |
| 512 | 3.0 | 333 | 1000.0 |
| 513 | 5.0 | 20 | 100.0 |
| 514 | 5.0 | 30 | 150.0 |
| 515 | 5.0 | 300 | 1500.0 |
| 516 | 5.0 | 320 | 1600.0 |
| 517 | 6.0 | 20 | 120.0 |
| 518 | 6.0 | 30 | 180.0 |
| 519 | 6.0 | 300 | 1800.0 |
| 520 | 6.0 | 317 | 1900.0 |

Evaluation

With respect to each of Sample Nos. 501 through 520, the leading 5 m long portion and the tail 5 m portion were extracted as specimens for evaluation, and each of the coating layers in the stripe shape was determined for stability of the coating thickness and coating width according to the same method as Example 1, and evaluated according to the same evaluation criteria as in Example 1. The results are shown in Table 10.

TABLE 10

| Sample No. | Stability of Coating Thickness | | | Stability of Coating Width | | | Remarks |
|---|---|---|---|---|---|---|---|
| | First Stripe | Second Stripe | Third Stripe | First Stripe | Second Stripe | Third Stripe | |
| 501 | C | C | C | C | C | C | Invention |
| 502 | C | C | C | C | C | C | Invention |
| 503 | C | C | C | C | C | C | Invention |
| 504 | B | B | B | C | C | C | Invention |
| 505 | C | C | C | B | B | B | Invention |
| 506 | B | B | B | B | B | B | Invention |
| 507 | B | B | B | B | B | B | Invention |
| 508 | A | A | A | C | C | C | Invention |
| 509 | C | C | C | B | B | B | Invention |
| 510 | B | B | B | A | A | A | Invention |
| 511 | A | A | A | A | A | A | Invention |
| 512 | A | A | A | C | C | C | Invention |
| 513 | C | C | C | B | B | B | Invention |
| 514 | B | B | B | A | A | A | Invention |
| 515 | A | A | A | A | A | A | Invention |
| 516 | A | A | A | C | C | C | Invention |
| 517 | C | C | C | C | C | C | Invention |
| 518 | B | B | B | C | C | C | Invention |
| 519 | A | A | A | C | C | C | Invention |
| 520 | A | A | A | C | C | C | Invention |

It has proved that when employing a slit-type die coater comprising at least one groove in the coating region in the coating width direction of the lip, the coating solution is coated at a coating solution viscosity of not more than 4.0 mPa·s, at a coating speed of not more than 10 m/minute and at a pressure at the slit outlet of the coating beads being negative or zero, and the wet coating thickness is from 0.1 to 5.0 μm, the coater gap being from 30 to 300 times the wet coating thickness exhibits particularly excellent stability of both coating thickness and coating width. Thus, the usefulness of the invention has been confirmed.

Example 6

Preparation of Strip-Shaped Substrate

The same belt-shaped substrate as Example 1 was prepared as the substrate.
(Preparation of Coating Solution)
The same coating solution as coating solution No. b used in Example 2 was prepared.
(Preparation of Slit-Type Die Coater)
The same slit-type die coater as prepared in Example 1 was prepared.
(Coating)
Employing the slit-type die coater, the coating solution prepared was coated on the belt-shaped substrate without a pressure reduction chamber, changing the coating speed as shown in Table 11, at a wet coating thickness of 2.0 μm under the following conditions to form three coating layers in the stripe shape layers as shown in FIG. 1, and dried. Thus, Sample Nos. 601 through 607 were prepared. The wet coating thickness was measured in the same manner as in Example 1.
(Coating Conditions)
As the coating conditions, the coating width was 300 mm, the coating length was 50 m, the coating temperature was 25° C. during coating, the coater gap was 200 μm which was 100 times the wet coating thickness, and the coating speed was 5 m/minute. The coating speed was measured in the same manner as in Example 1. The pressure at the slit outlet of the coating solution bead supplied from the slit outlet was −0.003 MPa. The pressure was measured in the same manner as in Example 1.
Evaluation With respect to each of Sample Nos. 601 through 607, the leading 5 m long portion and the rail 5 m long portion were extracted for evaluation, and each of the coating layers in the stripe shape was determined for stability of the coating thickness and coating width according to the same method as Example 1, and evaluated according to the same evaluation criteria as in Example 1. The results are shown in Table 11.

TABLE 11

| Sample No. | Coating Speed (m/min.) | Stability of Coating Thickness | | | Stability of Coating Width | | | Remarks |
|---|---|---|---|---|---|---|---|---|
| | | First Stripe | Second Stripe | Third Stripe | First Stripe | Second Stripe | Third Stripe | |
| 601 | 0.08 | C | C | C | C | C | C | Invention |
| 602 | 0.1 | A | A | A | B | B | B | Invention |
| 603 | 0.5 | A | A | A | A | A | A | Invention |
| 604 | 1.0 | A | A | A | A | A | A | Invention |
| 605 | 5.0 | A | A | A | A | A | A | Invention |
| 606 | 10.0 | B | B | B | A | A | A | Invention |
| 607 | 11.0 | C | C | C | C | C | C | Invention |

It has proved that when employing a slit-type die coater comprising at least one groove in the coating region in the coating width direction of the lip, the coating solution is coated at a wet coating thickness of from 0.1 to 5.0 μm, at a coating solution viscosity of not more than 4.0 mP·s, at a coater gap which is from 30 to 300 times the wet coating thickness, and at a pressure at the slit outlet of the coating beads being negative or zero, the coating speed of from 0.1 to 10.0 m/minute exhibits particularly excellent stability of both coating thickness and coating width. Thus, the usefulness of the invention has been confirmed.

Example 7

A belt-shaped organic EL panel structure (flexible substrate/first electrode (anode)/hole transport layer/light emission layer/electron transport layer/second electrode (cathode)/adhesive/seating member) was prepared as follows, and cut to prepare an organic EL element. Thus, sample No. 801 was prepared. Herein, the hole transport layer, light emission layer and electron transport layer were coated and formed employing a slit-type die coater as shown in FIG. 1, and the second electrode (cathode) was formed by a vapor deposition method.

(Preparation of Slit-Type Die Coater)

The same slit-type die coater as prepared in Example 1 was prepared.

<Preparation of Belt-Shaped Substrate>

A belt-shaped substrate, a polyethylene terephthalate film with a thickness of 100 μm, a width of 330 mm and a length of 500 m (produced by Teijin Dupont Films Co. Ltd., hereinafter abbreviated as PET) was provided as a substrate. An alignment mark to show a position where the first electrode and an extract electrode for the second electrode are to be formed was in advance provided on the surface of the substrate on which the first electrode was to be formed and at the same position as above on the first electrode opposite the substrate.

(Formation of First Electrode and Extract Electrode for Second Electrode)

The alignment mark provided on the PET being detected, a 120 nm thick ITO (indium tin oxide) layer was formed on the PET in accordance with the detected alignment mark under a vacuum pressure of $5 \times 10^{-1}$ Pa according to mask pattern layer formation employing a sputtering method, so that the first electrode with a size of 10 mm×5 mm having an extract electrode and an extract electrode with a size of 10 mm×3 mm for a second electrode were formed in three lines at a specific interval. The resulting material was rolled and stored.

(Preparation of Coating Solution for Hole Transport Layer Formation)

A solution, in which polyethylenedioxythiophene-polystyrene sulfonate (PEDOT/PSS, produced by Bayer Co., Ltd, Bytron P AI 4083) was diluted with pure water and methanol to contain 65% of pure water and 5% of methanol to prepare a coating solution for hole transport layer formation. The viscosity of the coating solution for hole transport layer formation was 0.7 mPa·s. The viscosity was measured at 20° C. employing a digital viscometer LVDV-I produced by Brookfield Co., Ltd.

(Formation of Hole Transport Layer)

After the PET roll, in which the first electrode and the extract electrode for the second electrode were continuously formed in three lines in the longitudinal direction, was subjected to charge neutralization treatment, the coating solution for hole transport layer formation was coated on the three lines of the first electrode and the extract electrode for the second electrode formed in the longitudinal direction on the PET supported on a backup roller (except for both edge portions having a width of 10 mm) under the following conditions, employing the slit-type die coater prepared above, and subjected to drying and heating treatment to form three stripe hole transport layers.

(Charge Neutralization Treatment)

A non-contact type antistatic device was utilized on the first electrode surface side of the substrate and a contact type antistatic device on the surface side of the substrate opposite the first electrode. As the non-contact type antistatic device, a flexible AC type ionizing bar MODEL 4100V produced by Hugle Electronics Co., Ltd. was utilized. As the contact type antistatic device, a conductive guide roll ME-102 produced by Miyako Roller Kogyo Co., Ltd. was utilized.

(Coating Condition of Coating Solution for Hole Transport Layer Formation)

The coating solution for hole transport layer formation was coated on the substrate at a pressure at the slit outlet of the coating beads of −0.001 MPa, the coating beads being those of the coating solution supplied from the slit outlet, at a coating speed of not more than 5 m/minute, at a wet coating thickness of 2.0 μm, at a coater gap of 200 μm which was 200 times the wet coating thickness. Coating of the coating solution for hole transport layer formation was carried out at a temperature of 25° C., at a $N_2$ gas atmosphere of a dew point of not higher than −20° C. under atmospheric pressure, and at a cleanliness degree of not higher than class 5 (measured based on JISB 9920). The wet coating thickness implies a theoretical thickness computed by the following formula:

Coating solution supply amount/(Coating width× Coating speed)

The coating speed was measured according to a Laser Doppler Velocity Meter LV203 produced by Mitsubishi Denki Co., Ltd.

Drying and Heating Treatment Condition

The drying and heating treatment condition of a coating layer for the hole transport layer was as follows. The drying treatment was carded out in a dryer where air is blown on the coating surface from the outlet of the nozzle slit of the dryer, at a blown air speed of 1 m/s, at a blown air speed distribution of 5% and at 150° C. to remove the solvent, the outlet being located above and 100 mm distant from the coating surface, and further the heating treatment was carried out at 150° C. in a heater employing a rear surface heat conducting process. Thus, three stripe hole transport layers were formed.

(Preparation of Coating Solution for Light Emission Layer Formation)

| Dicarbazole derivative (CBP) | 1.00% by mass |
| Iridium complex (Ir(ppy)$_3$) | 0.05% by mass |
| Toluene | 98.95% by mass |

The viscosity of the coating solution for light emission layer formation was 0.79 mPa·s.

The viscosity was measured at 20° C. employing a digital viscometer LVDV-I produced by Brookfield Co., Ltd.

(Formation of Light Emission Layer)

After the PET in roll, on which the three stripe hole transport layers had been formed, was subjected to charge neutralization treatment, the coating solution for light emission layer formation was coated on the three stripe hole transport layers (except for on both edge portions of the PET having a width of 10 mm) without providing a pressure reduction chamber under the following conditions, employing the slit-type die coater prepared above, and then subjected to drying and heating treatment at a drying zone under the following conditions to form three stripe light emission layers on the three stripe hole transport layers. The resulting material was rolled and stored.

(Charge Neutralization Treatment)

A non-contact type antistatic device was utilized on the light emission layer surface side of the substrate and a contact type antistatic device on the surface side of the substrate opposite the light emission layer. The non-contact type antistatic device and the contact type antistatic device were the same devices as utilized in the hole transport layer formation above.

(Coating Condition of Coating Solution for Light Emission Layer Formation)

The coating solution for light emission layer formation was coated on the substrate at a pressure at the slit outlet of the coating beads of –0.001 MPa, the coating beads being those of the coating solution supplied from the slit outlet, at a coating speed of not more than 5 m/minute, at a wet coating thickness of 2.0 μm, at a coater gap of 200 μm which was 100 times the wet coating thickness. Coating of the coating solution for light emission layer formation was carried out at a temperature of 25° C., at a $N_2$ gas atmosphere of a dew point of not higher than –20° C. under atmospheric pressure, and at a cleanliness degree of not higher than class 5 (measured based on JISB 9920). The coating speed was measured in the same manner as that of the hole transport layer Drying and Heating Treatment Condition The drying and heating treatment condition of a coating layer for the light emission layer was as follows. The drying treatment was carried out in a dryer where air is blown on the coating surface from the outlet of the nozzle slit of the dryer, at a blown air speed of 1 m/s, at a blown air speed distribution of 5% and at 150° C. to remove the solvent, the outlet being located above and 100 mm distant from the coating surface, and further the heating treatment was carried out at 150° C. in a heater employing a rear surface heat conducting process. Thus, a light emission layer was formed.

(Preparation of Coating Solution for Electron Transport Layer Formation)

A 1-butanol solution containing an electron transport material 1 in an amount of 0.5% by mass was prepared as the coating solution for electron transport layer.

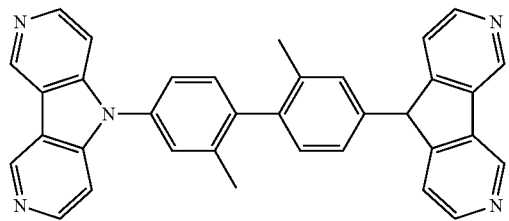

Electron Transport Material 1

(Formation of Electron Transport Layer)

After the PET in roll on which the three stripe light emission layers was formed was subjected to charge neutralization treatment, the coating solution for electron transport layer formation was coated on the three stripe light emission layers (except for on both edge portions of the PET having a width of 10 mm) without providing a pressure reduction chamber under the following conditions, employing the slit-type die coater prepared above, and then subjected to drying and heating treatment at a drying zone under the following conditions to form an electron transport layer, whereby the PET with three stripe electron transport layers was prepared. The resulting PET was rolled and stored.

(Charge Neutralization Treatment)

A non-contact type antistatic device was utilized on the electron transport layer surface side of the substrate and a contact type antistatic device on the surface side of the substrate opposite the electron transport layer. The non-contact type antistatic device and the contact type antistatic device were the same devices as utilized in the hole transport layer formation above.

(Coating Condition of Coating Solution for Electron Transport Layer Formation)

The coating solution for electron transport layer formation was coated on the substrate at a pressure at the slit outlet of the coating beads of –0.001 MPa, the coating beads being those of the coating solution supplied from the slit outlet, at a coating speed of not more than 5 m/minute, at a wet coating thickness of 2.0 μm, at a coater gap of 200 μm which was 100 times the wet coating thickness. Coating of the coating solution for electron transport layer formation was carried out at a temperature of 25° C., at a $N_2$ gas atmosphere of a dew point of not higher than –20° C. under atmospheric pressure, and at a cleanliness degree of not higher than class 5 (measured based on JISB 9920). The coating speed was measured in the same manner as that of the hole transport layer above.

Drying and Heating Treatment Condition

The drying and heating treatment condition of a coating layer for the electron transport layer was as follows. The drying treatment was carried out in a dryer where air is blown on the coating surface from the outlet of the nozzle slit of the dryer, at a blown air speed of 1 m/s, at a blown air speed distribution of 5% and at 150° C. to remove the solvent, the outlet being located above and 100 mm distant from the coating surface, and further subjected to heating treatment at 150° C. in a heater employing a rear surface heat conducting process to. Thus, an electron transport layer was formed.

(Formation of Second Electrode)

Successively, the alignment mark marked on the PET with the electron transport layer having being detected, aluminum as material for second electrode formation was vapor deposited on the electron transport layer under a vacuum pressure of $5 \times 10^{-4}$ Pa employing a mask pattern layer formation method so as to be in accordance with the detected alignment mark and with the size of the first electrode and the size capable of contacting the second electrode pickup electrode, whereby a second electrode with a thickness of 100 nm was formed so that the second electrode was provided on the first electrode and provided so as to connect the extract electrode for the second electrode.

(Coating of Adhesive Layer)

The alignment mark provided on the PET on which the second electrode had been provided being detected, an ultraviolet ray curable liquid adhesive (of epoxy type) was coated at the light emission region and around the light emission region in accordance with the detected alignment mark except for the edge portions of the first electrode and the extract electrode for the second electrode to form an adhesive layer with a thickness of 30 μm.

(Lamination of Sealing Member)

Thereafter, a belt-shaped sheet sealing member described later was superposed on the surface of the adhesive layer by means of a roller laminator, press adhered to the surface at a roller pressure of 0.1 MPa under atmospheric pressure, and exposed to a 365 nm light at an exposure intensity of 20 mW/cm$^2$ for one minute employing a high pressure mercury lamp provided 15 mm distant from the surface to be exposed, whereby the sealing member was fixed and laminated to the adhesive layer surface. The resulting material had a structure in which a plurality of organic EL panels were continuously arranged.

(Preparation of Sealing Member)

As a sealing member, a belt-shaped sheet sealing member, comprising two layers composed of PET film (produced by Dupont Films Co. Ltd.) and an inorganic layer (SiN) as a bather layer, was prepared. The thickness of PET was 100 μm and the thickness of the barrier layer was 200 nm. The barrier layer was formed on the PET according to a sputtering method. The water vapor transmission degree was 0.01 g/m²·day, measured according to a method based on JIS K-7129B (1992), mainly a MOCON method. The oxygen transmission degree was 0.1 ml/m²·day·MPa, measured according to a method based on JIS K-7126B (1987), mainly a MOCON method.

(Cutting)

Subsequently, the alignment marks marked on the PET, the material having a structure in which a plurality of organic EL panels were continuously arranged was cut into an individual organic EL element size according to the positions of the alignment marks detected. Thus, an individual organic EL panel was prepared.

Evaluation

With respect to the organic EL element prepared above, samples at the leading 5 m long portion and at the tail 5 m long portion were extracted, determined for leakage current property and emission unevenness (luminance unevenness) according to the method as described below, and evaluated according to the evaluation criteria as described below. As a result, both the leakage current property and emission unevenness (luminance unevenness) of the sample were rated as A, and the usefulness of the invention has been evidenced.

Leakage Current Property Test

When 5V of voltage in the reverse direction (reverse bias) was applied for 5 seconds to the organic EL element sample, employing a constant voltage power source, current flowing in the sample was measured. The currents at the emission area of 10 samples were measured, and the maximum current was defined as leakage current.

Evaluation of Leakage Current Property

A: The maximum current was less than $1\times10^{-6}$ A.
B: The maximum current was $1\times10^{-6}$ to less than $1\times10^{-5}$ A.
C: The maximum current was $1\times10^{-5}$ to less than $1\times10^{-3}$ A.
D: The maximum current was not less than $1\times10^{-3}$ A.

Measurement of Emission Unevenness (Luminance Unevenness)

When 5V of direct current was applied to 6 emission portions at the center of the organic EL element sample, employing a constant voltage power source, the luminance difference among those portions was visually observed, and evaluated according to the following evaluation criteria.

A: No luminance difference was observed at 6 emission portions.
B: Luminance at one emission portion was different of luminances at 6 emission portions.
C: Luminances at 2 to less than 4 emission portions is different of luminances at 6 emission portions.
D: Luminances at 4 or more emission portion is different of luminances at 6 emission portions.

EXPLANATION OF SYMBOLS

1. Slit-type Die Coater
102a, 102d. Notch
102b, 102c. Groove
103. Lip
104. Slit
104a, 104a1, 104a2. Slit Outlet
A. Coater Gap
Ja, Jb Depth
K, L1 through L4, N1 through N3. Width
O. Slit Clearance
X. Coating Position
Q Bead

The invention claimed is:

1. A coating method of coating a coating solution on a substrate employing a slit-type die coater comprising a lip tip and, provided at the lip tip, a slit outlet and at least one groove facing a coating region in a coating width direction, the slit outlet and the groove being alternately provided, the method comprising the steps of:
allowing the lip tip of the slit-type die coater to be close to the substrate;
ejecting a coating solution from the slit outlet to form a bead between the lip tip and the substrate, where the coating solution is not ejected from the groove; and
coating on the substrate the ejected coating solution while relatively moving the slit-type die coater and the substrate, thereby forming on the substrate at least two coating layers in a stripe shape separated from each other and arranged side by side, and a non-coating portion between the two coating layers wherein the coating is carried out at a pressure at the slit outlet being negative or zero.

2. The coating method of claim 1, wherein the coating is carried out to give a wet coating thickness of from 0.1 to 5.0 μm.

3. The coating method of claim 2, wherein a clearance between the substrate and the lip tip is from 30 to 300 times the wet coating thickness.

4. The coating method of claim 1, wherein the coating solution has a viscosity of not more than 4.0 mPa·s.

5. The coating method of claim 1, wherein the groove has a depth of from 1.0 to 10 mm.

6. The coating method of claim 1, wherein the coating is carried out at a coating speed of from 0.1 to 10.0 m/minute.

7. An organic electroluminescence comprising a substrate and provided thereon, a first electrode, a second electrode and an organic compound layer including a light emission layer, the organic compound layer being provided between the first electrode and the second electrode, wherein the organic compound layer is formed by the coating method of claim 1.

8. The coating method of claim 1, wherein the lip tip comprises a front lip and a back lip, and the groove extends through and transverse to the front lip and the back lip.

9. The coating method of claim 8, wherein a width in the coating width direction of the groove is not less than 0.5 mm.

* * * * *